US007456401B2

United States Patent
Kanematsu (10) Patent No.: US 7,456,401 B2
(45) Date of Patent: Nov. 25, 2008

(54) PROJECTION ELECTRON MICROSCOPE, ELECTRON MICROSCOPE, SPECIMEN SURFACE OBSERVING METHOD AND MICRO DEVICE PRODUCING METHOD

(75) Inventor: Erika Kanematsu, Funabashi (JP)

(73) Assignees: Nikon Corporation, Tokyo (JP); Ebara Corporation, Tokyo (JP)

( * ) Notice: Subject to any disclaimer, the term of this patent is extended or adjusted under 35 U.S.C. 154(b) by 343 days.

(21) Appl. No.: 10/585,995

(22) PCT Filed: Jan. 13, 2005

(86) PCT No.: PCT/JP2005/000625

§ 371 (c)(1), (2), (4) Date: Jul. 13, 2006

(87) PCT Pub. No.: WO2005/069346

PCT Pub. Date: Jul. 28, 2005

(65) Prior Publication Data
US 2007/0164217 A1   Jul. 19, 2007

(30) Foreign Application Priority Data
Jan. 14, 2004   (JP) ............................ 2004-006422

(51) Int. Cl.
H01J 37/29   (2006.01)
(52) U.S. Cl. ...................... 250/310; 250/307
(58) Field of Classification Search ............... 250/310, 250/307
See application file for complete search history.

(56) References Cited

U.S. PATENT DOCUMENTS 5,929,439 A      7/1999   Todokoro et al.
6,310,341 B1    10/2001   Todokoro et al.
6,667,477 B2 *  12/2003   Grzelakowski .............. 250/310
7,365,324 B2 *   4/2008   Noji et al. .................... 250/310

FOREIGN PATENT DOCUMENTS

| JP | 11-238484 | 8/1999 |
| JP | 2001-332593 | 11/2001 |
| JP | 2002-141010 | 5/2002 |
| JP | 2002-216692 | 8/2002 |

* cited by examiner

Primary Examiner—Jack I Berman
(74) Attorney, Agent, or Firm—Morgan, Lewis & Bockius LLP (57) ABSTRACT

The illuminating beam 4 emitted from the cathode 1 is incident on a deflector 3. In a state in which a voltage is applied to the deflector 3, the optical path of the illuminating beam 4 is altered by the deflector 3; the illuminating beam 4 then passes through a common electron optical system 7, and illuminates the surface of the sample 6. In cases where no voltage is applied to the deflector 3, the illuminating beam 4 passes directly through the deflector 3, and is absorbed by an electron absorbing plate 17. The illuminating beam 4 is attenuated when it passes through the common electron optical system 7, so that the energy of this beam 4 is close to 0 [eV] at the point in time at which the beam 4 reaches the surface of the sample 6. When the illuminating beam 4 is incident on the sample 6, reflected electrons 8 are generated from the sample 6. These reflected electrons 8 pass through the common electron optical system 7, and in a case where no voltage is applied to the deflector 3, these reflected electrons 8 pass through the image focusing electron optical system 9, so that the electrons are projected onto an MCP detector 10.

23 Claims, 5 Drawing Sheets

PROJECTION ELECTRON MICROSCOPE, ELECTRON MICROSCOPE, SPECIMEN SURFACE OBSERVING METHOD AND MICRO DEVICE PRODUCING METHOD

TECHNICAL FIELD

The present invention relates to a projection electron microscope, electron microscope and sample surface observation method used for the observation, inspection, or the like of the surfaces of objects by illuminating the sample surface with an electron beam and using the reflected electrons that are generated as a result, and also relates to a micro-device manufacturing method using this projection electron microscope.

BACKGROUND ART

A projection electron microscope observes sample surfaces in two dimensions by using an electron optical system to illuminate the sample surface with an electron beam, and then using this electron optical system to focus the secondary electrons or reflected electrons generated as a result on the detection surface of a detector. This makes it possible to reduce the scanning frequency (unlike an SEM); accordingly, the sample observation time can be shortened, and such microscopes have attracted attention as inspection devices for micro-devices such as semiconductors.

Figure 5:
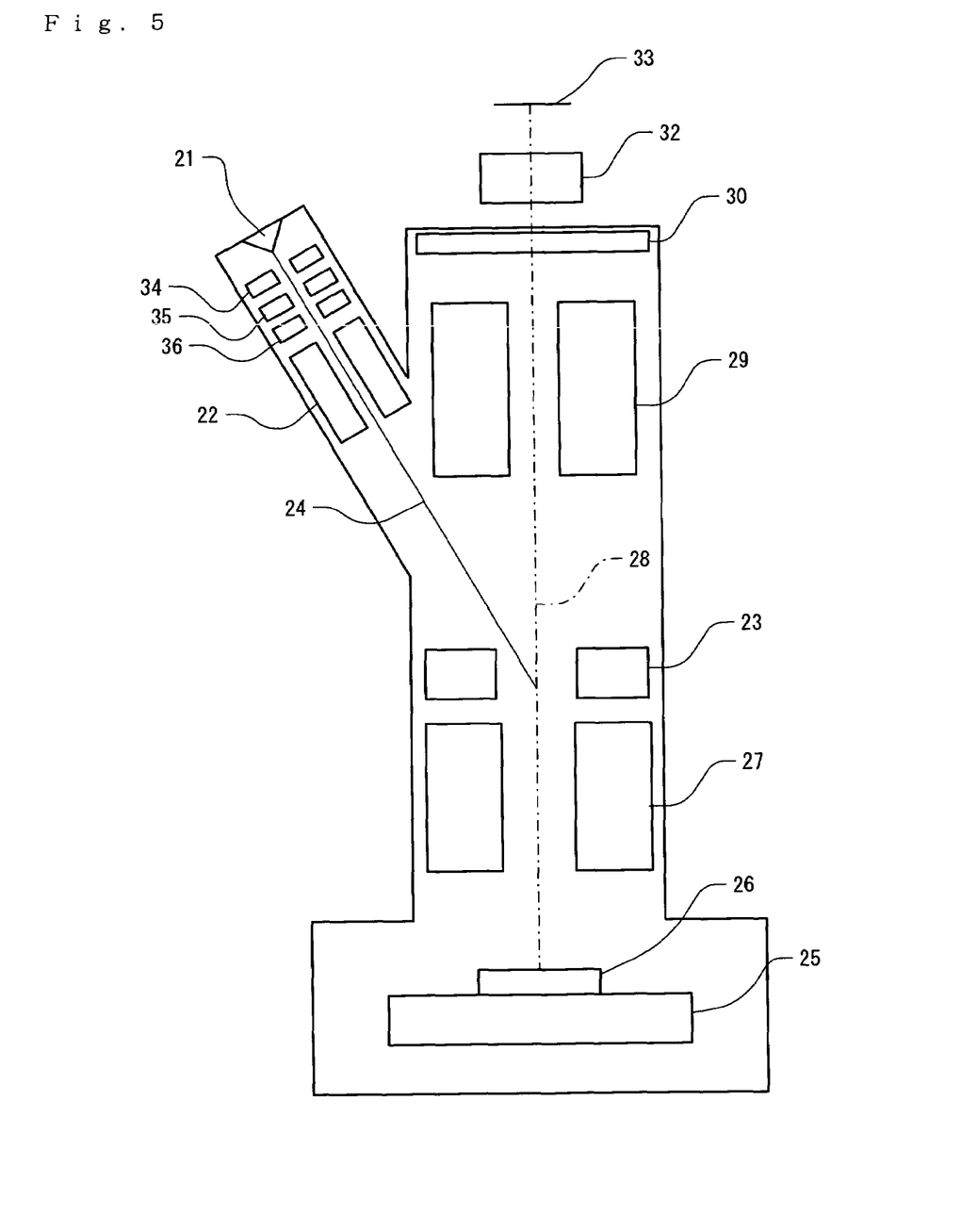
FIG. 5 is a diagram showing an outline of the optical system of a conventionally conceivable projection microscope.

FIG. 5 shows one example of a microscope that is conceivable as such a projection electron microscope. The illuminating beam 24 emitted from the cathode 21 passes through a Wehnelt electrode, first anode 35, second anode 36, and illumination dedicated electron optical system 22, and is incident on an electromagnetic prism 23. The optical path of the illuminating beam 24 is altered by the electromagnetic prism 23; the illuminating beam 24 then passes through a cathode lens 27, and illuminates the surface of the sample 26.

When the illuminating beam 24 is incident on the sample 26, secondary electrons, back-scattered electrons and reflected electrons (referred to collectively as generated electrons 28) having a distribution corresponding to the surface shape, material distribution, variations in potential, and the like of the sample 26 are generated from the sample 26. These generated electrons 28 pass through the cathode lens 27, electromagnetic prism 23, and image focusing dedicated electron optical system 29, and are projected onto an MCP (micro channel plate) detector 30. Then, an image is projected onto a CCD camera 33 via a light-mapping optical system 32. 25 indicates a sample stage. Furthermore, the image focusing electron optical system is constructed from the image focusing dedicated electron optical system 29, electromagnetic prism 23, and cathode lens 27, and the illumination electron optical system is constructed from the illumination dedicated electron optical system 22, cathode lens 27, and electromagnetic prism 23.

In such a projection electron microscope, as is seen from FIG. 5, the optical path of the electron beam that is incident on the sample 26 and the optical path of the electron beam that is emitted from the sample 26 are switched by the electromagnetic prism 23 (E×B). Accordingly, in the optical path between the sample 26 and the electromagnetic prism 23, a Coulomb effect is generated between the electrons in the illuminating electron beam and the electrons that are generated from the sample and used for observation. Consequently, the problem of blurring of the image that is focused has been encountered.

Furthermore, the electromagnetic prism 23 generates a large astigmatic aberration. It is very difficult to adjust both the illumination electron optical system and image focusing electron optical system in order to correct this aberration. Conventionally, therefore, design and adjustment have been performed by aligning the viewpoint with the image focusing electron optical system, and the adjustment of the illumination electron optical system has often been insufficient.

Moreover, as is seen from FIG. 5, the illumination electron optical system and the image focusing electron optical system are designed as completely separate systems in a conventional apparatus; accordingly, a correspondingly larger number of electron beam optical members must be used.

DISCLOSURE OF THE INVENTION

The present invention was devised in light of such circumstances; it is an object of the present invention to provide a projection electron microscope or other type of electron microscopes with a system using reflected electrons as an observation electron beam, which has a small Coulomb effect, and to provide such a microscope in which the number of electron optical members used is reduced. In addition, it is also an object of the present invention to provide a sample surface observation method and micro-device manufacturing method using such a projection electron microscope or ordinary electron microscope.

The first invention that is used to achieve the object described above is a projection electron microscope which causes an illuminating electron beam emitted from an electron source to be incident on a sample surface via an illumination electron optical system, and which causes electrons emitted from this sample surface to be focused as an observation electron beam on a detection means via an image focusing electron optical system, wherein this projection electron microscope has an optical path switching means which switches the direction of the illuminating electron beam or observation electron beam, and the optical path switching means has the function of switching the direction of the respective electron beams so that the illuminating electron beam is incident on the sample surface at a specified timing, and so that the observation electron beam reaches the detection means at a different specified timing.

In the present invention, unlike the projection electron microscope shown in FIG. 5, the timing at which the illuminating electron beam that is caused to illuminate the sample surface via the electron optical system passes through the optical path switching means, and the timing at which the reflected electrons that are emitted from the sample surface and that reach the detector via the electron optical system pass through the optical path switching means, are caused to differ by the optical path switching means without using an electromagnetic prism. As a result, the Coulomb effect between the illuminating electron beam and the reflected electrons can be reduced, so that blurring of the focus can be reduced. For example, a simple electron optical element such as a deflector can be used as the optical path switching means.

The second invention that is used to achieve the object described above is the first invention, wherein the observation electron beam consists of reflected electrons having an energy equal to that of the illuminating electron beam, the illumination electron optical system consists of an illumination dedicated electron optical system disposed between the electron source and the optical path switching means, and an electron optical system disposed between the optical path switching means and the sample surface, the image focusing electron optical system consists of an image focusing dedicated electron optical system disposed between the detection means and the optical path switching means, and the electron optical system mentioned above, and the electron optical system shares some of the functions of the illumination electron optical system and the image focusing electron optical system.

In the present invention, reflected electrons having an energy equal to that of the illuminating electron beam are used as the observation electron beam; accordingly, in cases where portions of the image focusing electron optical system and illumination electron optical system are used as a common optical system, if the system is designed with the aberration of the image focusing electron optical system (which is an enlarging system) suppressed, then the illumination electron optical system (which is conversely a reducing system) is also designed with good precision. Between the optical path switching means and the sample surface, the observation electron beam that is emitted in the direction in which the illuminating electron beam is incident follows the path along which the illuminating electron beam is incident, and reaches the optical path switching means.

Specifically, as a result of reflected electrons being used as the observation electrons, at least some of the elements of the illumination electron optical system and image focusing electron optical system that were conventionally designed as separated elements can be disposed as common elements between the optical path switching means and sample surface.

For example, in cases where the electron optical system (common electron optical system) is provided with a function that alters the magnification of the image focusing electron optical system, and zooming is performed by altering the magnification of the image focusing electron optical system, or in cases where the shape of the visual field (aspect ratio) is altered in this way, the illumination electron optical system can be caused to move in linkage at the same time, so that the illumination field is enlarged or reduced, or so that the shape of the illumination field (aspect ratio) is altered. Furthermore, by forming the optical systems in common, the overall optical system can be kept to a smaller size than conventional systems.

The third invention that is used to achieve the object described above is the first invention, wherein the observation electron beam consists of reflected electrons having an energy equal to that of the illuminating electron beam, and the illumination electron optical system and the image focusing electron optical system consist only of an electron optical system disposed between the optical path switching means and the sample surface.

In this invention, the illumination electron optical system and the image focusing electron optical system are formed completely in common as an electron optical system disposed between the optical path switching means and sample surface. Accordingly, the construction of the apparatus can be further simplified.

The fourth invention that is used to achieve the object described above is any of the first through third inventions, wherein the optical path switching means has the function of conducting the illuminating electron beam to the sample surface in a time that is equal to or less than the time required for the electrons in the illuminating electron beam to reach the sample surface from the optical path switching means.

In this invention, the optical path switching means has the function of conducting the illuminating electron beam to the sample surface in a time that is shorter than the time required for the electrons in the illuminating electron beam to reach the sample surface from the optical path switching means.

Accordingly, for example, where T is the time required for the electrons in the illuminating electron beam to reach the sample surface from the optical path switching means, the illuminating electron beam is conducted to the sample surface in this time T. Then, in the next time T, the reflected electrons emitted from the sample are conducted to the detection means, and these operations are alternately repeated. The influence of the Coulomb effect can be reduced as the time required in order to conduct the illuminating electron beam to the electron optical system is made shorter than T.

The fifth invention that is used to achieve the object described above is any of the first through third inventions, wherein the optical path switching means has the function of conducting the illuminating electron beam to the sample surface in a time that is equal to or less than the time required for the electrons in the illuminating electron beam to complete a round trip between the most constricted point of the electron beam and the sample in the electron optical system.

This invention also aims at the same operational effect as the fourth invention; in this invention, however, the illumination time of the electron beam is further shortened, and the system is arranged so that the illumination of the sample with an electron beam is performed for a time that is equal to or less than the time required for the electron beam to complete a round trip between the most constricted point of the electron beam and the sample in the electron optical system. The point where the Coulomb effect is most conspicuously generated is the point where the electron beam is most constricted in the electron optical system. Accordingly, by illuminating the sample with the electron beam for a time that is equal to or less than the time required for the electron beam to complete a round trip between this point and the sample, it is possible to reduce the influence of the Coulomb effect more effectively.

The sixth invention that is used to achieve the object described above is a projection electron microscope which causes an illuminating electron beam emitted from an electron source to be incident on a sample surface via an illumination electron optical system, and which causes electrons emitted from this sample surface to be focused as an observation electron beam on a detection means via an image focusing electron optical system, wherein the observation electron beam consists of reflected electrons having an energy equal to that of the illuminating electron beam, the illumination electron optical system consists of an illumination dedicated electron optical system disposed between the electron source and the optical path switching means, and an electron optical system disposed between the optical path switching means and the sample surface, the image focusing electron optical system consists of an image focusing dedicated electron optical system disposed between the detection means and the optical path switching means, and the electron optical system described above, and this electron optical system shares some of the functions of the illumination electron optical system and the image focusing electron optical system.

The seventh invention that is used to achieve the object described above is a micro-device manufacturing method having a step in which the surface of a micro-device or intermediate product of the same is inspected using the projection electron microscope of any of the first through sixth inventions.

In this invention, since the inspection is performed using a projection electron microscope that has a simple construction, the manufacturing cost can be reduced.

The eighth invention that is used to achieve the object described above is an electron microscope, comprising an electron source which causes an illuminating electron beam to be incident on a sample surface, a detector which detects electrons emitted from the sample surface as an observation electron beam, and an optical path switching means which causes the illuminating electron beam to be incident on the sample surface at a specified timing, and which causes the observation electron beam to reach the detector at a different specified timing.

The ninth invention that is used to achieve the object described above is the eighth invention, wherein the optical path switching means has the function of switching between the specified timing described above and the other specified timing described above according to whether or not a voltage is applied to this optical path switching means.

The tenth invention that is used to achieve the object described above is a sample surface observation method for observing a sample surface, wherein an illuminating electron beam is emitted, this illuminating electron beam is caused to be incident on the sample surface at a specified timing, observation electrons emitted from the sample surface are caused to reach a detector at a timing that is different from the specified timing described above, and the observation electrons are detected by the detector, so that an image of the sample surface is acquired.

BEST MODE FOR CARRYING OUT THE INVENTION

Figure 1:
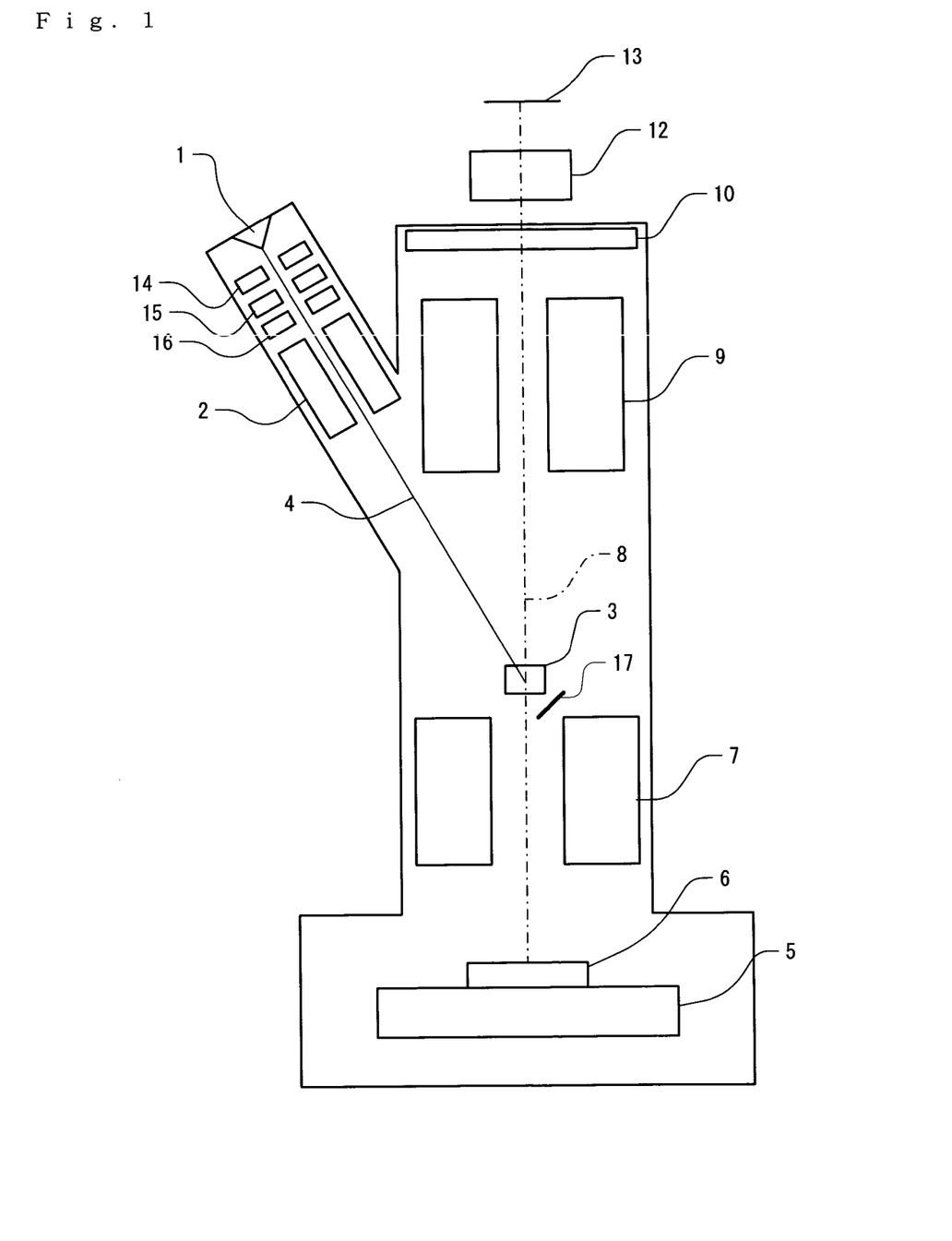
FIG. 1 is a diagram showing an outline of the optical system of a projection microscope constituting a first working configuration of the present invention.

Working configurations of the present invention will be described below with reference to the figures. FIG. 1 is a diagram showing an outline of the optical system of a projection microscope constituting a first working configuration of the present invention. The illuminating beam 4 emitted from the cathode 1 passes through a Wehnelt electrode 14, a first anode 15, a second anode 16, and an illumination dedicated electron optical system 2, and is incident on a deflector 3. In a state in which a voltage is applied to the deflector 3, the optical path of the illuminating beam 4 is altered by the deflector 3, after which the illuminating beam 4 passes through a common electron optical system 7 consisting mainly of a cathode lens, and illuminates the surface of the sample 6. In a case where no voltage is applied to the deflector 3, the illuminating beam 4 passes directly through the deflector 3, and is absorbed by an electron absorbing plate 17.

In this way, the Coulomb effect generated between the electrons in the illuminating beam 4 and the generated electrons 8 can be reduced, so that blurring of the image focusing electron optical system can be reduced.

In this working configuration, the potential difference that is applied to the cathode 1 and sample stage 5 is set at 0 V or at a value close to 0 V (here, the potential V1 of the cathode 1 is smaller than or substantially equal to the potential V2 of the sample stage 5, i.e., $V1 \leq V2$). The illuminating beam 4 that is emitted from the cathode 1 passes through the Wehnelt electrode 14, first anode 15, second anode 16, and illumination dedicated electron optical system 2, and is incident on the deflector 3. In a state in which a voltage is applied to the deflector 3, the optical path of the illuminating beam 4 is altered by the deflector 3, after which the illuminating beam 4 passes through the common electron optical system 7, and illuminates the surface of the sample 6. In a case where no voltage is applied to the deflector 3, the illuminating beam 4 passes directly through the deflector 3, and is absorbed by the electron absorbing plate 17.

Since the cathode 1 and sample stage 5 are set at the same potential or at a potential difference of a few volts or less, the energy of the illuminating beam 4 at the point in time at which this beam 4 reaches the surface of the sample 6 is 0 [eV] or (V2−V1) [eV].

When the illuminating beam 4 is incident on the sample 6, reflected electrons 8 having a distribution according to the surface shape, material distribution, variations in potential, and the like of the sample 6 are generated from the sample 6. Since the energy of the illuminating beam 4 is low, almost no secondary electrons are generated. These reflected electrons 8 pass through the common electron optical system 7, and in cases where no voltage is applied to the deflector 3, these reflected electrons 8 pass through the image focusing electron optical system 9, and are projected onto an MCP (micro channel plate) detector 10. An image is then projected onto a CCD camera 13 via a light-mapping optical system 12. Furthermore, 5 indicates a sample stage.

As was described above, since the energy of the illuminating beam 4 is almost 0 [eV] at the surface of the sample 6, the initial energy of the reflected electrons is also almost 0 [eV]. Accordingly, these reflected electrons are accelerated by the common electron optical system 7; in this case, however, since the energy is almost the same as that of the illuminating beam 4, the reflected electrons 8 emitted in the direction in which the illuminating beam 4 was incident follow in reverse the optical path along which the illuminating beam 4 was incident.

If the common electron optical system 7 is formed as a zoom optical system, then the illumination region of the illuminating beam 4 is simultaneously narrowed by increasing the enlargement magnification of the common electron optical system 7 in order to increase the enlargement magnification of the observation system. Accordingly, there is no need to adjust the illuminating beam using a separate electronic lens system.

Thus, portions of the optical system that were conventionally disposed separately in the illumination dedicated electron optical system 22 and image focusing dedicated electron optical system 29 can be formed in common by installing these as functions in the common electron optical system 7, so that the number of electron optical members required can be reduced. Even if this is done, there is almost no effect on the optical characteristics since a deflector 3 is used for the switching of the optical path.

The electron optical members that cannot be formed in common are disposed in the illumination dedicated electron optical system 2 and image focusing dedicated electron optical system 9. For example, in cases where there is a difference in the size of the cathode 1 or field diaphragm of the illumination electron optical system and the size of the MCP detector 10, a simple optical system that adjusts the magnification ratio may be disposed in the illumination dedicated electron optical system 2. Moreover, since the ratio of the size of the cathode 1 or field diaphragm of the illumination electron optical system and the size of the MCP detector 10 is fixed, there is no need for an optical system to adjust the magnification ratio.

Furthermore, in cases where critical illumination of the sample 6 is desired, the crossover plane of the electron source and the surface of the sample 6 are made conjugate, and in cases where Koehler illumination of the sample 6 is desired, the field diaphragm of the illumination electron optical system and the surface of the sample 6 are made conjugate.

Moreover, it is desirable that the time for which a voltage is applied to the deflector 3 so that the illuminating beam 4 is deflected to the side of the common electron optical system 7 be set equal to or less than the time T required for the electrons in the illuminating beam 4 to reach the sample 6 from the deflector 3. If this is done, the Coulomb effect that is generated between the electrons in the illuminating beam 4 and the reflected electrons 8 can be reduced, so that the blurring of the image focusing electron optical system can be reduced.

In addition, by setting the time for which a voltage is applied to the deflector 3 at a time that is equal to or less than the time required for the electron beam to complete a round trip between the position where the electron beam is most constricted by the common electron optical system 7 (i.e., the crossover position) and the sample 6, it is possible to suppress the generation of the Coulomb effect more effectively, so that blurring of the image focusing electron optical system can be reduced.

Furthermore, even in cases where the reflected electrons 8 deflected by the deflector 3 may form stray light and cause trouble when the deflector 3 is excited, the use of the arrangement described above makes it possible to devise the system so that the reflected electrons 8 do not pass through the deflector 3 when the deflector 3 is excited. Accordingly, such generation of stray light can be prevented.

Figure 2:
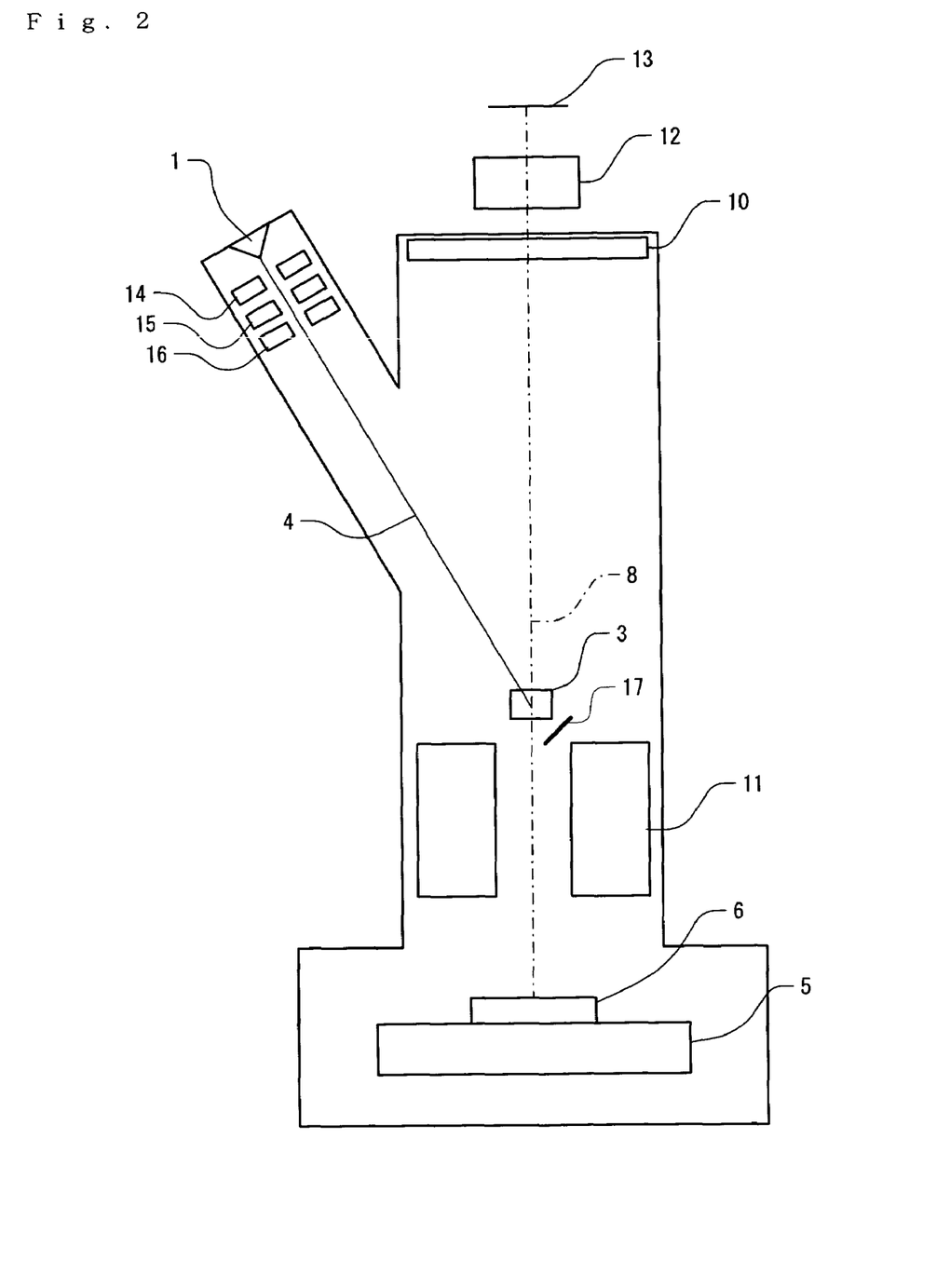
FIG. 2 is a diagram showing an outline of the optical system of a projection microscope constituting a second working configuration of the present invention.

FIG. 2 is a diagram showing an outline of the optical system of a projection microscope constituting a second working configuration of the present invention. In the following description, as a rule, constituent elements that are the same as constituent elements in the figure already indicated in this section are labeled with the same symbols, and a description of such elements is omitted.

The working configuration shown in FIG. 2 differs from the working configuration shown in FIG. 1 in that the illumination dedicated electron optical system 2 and image focusing dedicated electron optical system 9 are completely omitted. Since the remaining portions are the same, only different portions will be described.

Specifically, in this working configuration, the illumination dedicated electron optical system 2 and image focusing dedicated electron optical system 9 shown in FIG. 1 are formed as a completely common system, and are accommodated in the portion indicated as the common electron optical system 11. Furthermore, the crossover position of the electron beam source (cathode 1, Wehnelt electrode 14, first anode 15 and second anode 16) and the surface of the sample 6, and the detection surface of the MCP detector 10 and the surface of the sample 6, are respectively made conjugate with respect to the common electron optical system 11. Accordingly, as a result of the action of the common electron optical system 11, the illuminating beam 4 from the electron beam source applies critical illumination or Koehler illumination to the surface of the sample 6, and an image of the sample 6 is focused on the detection surface of the MCP detector 10 as a result of the action of the common electron optical system 11.

Figure 3:
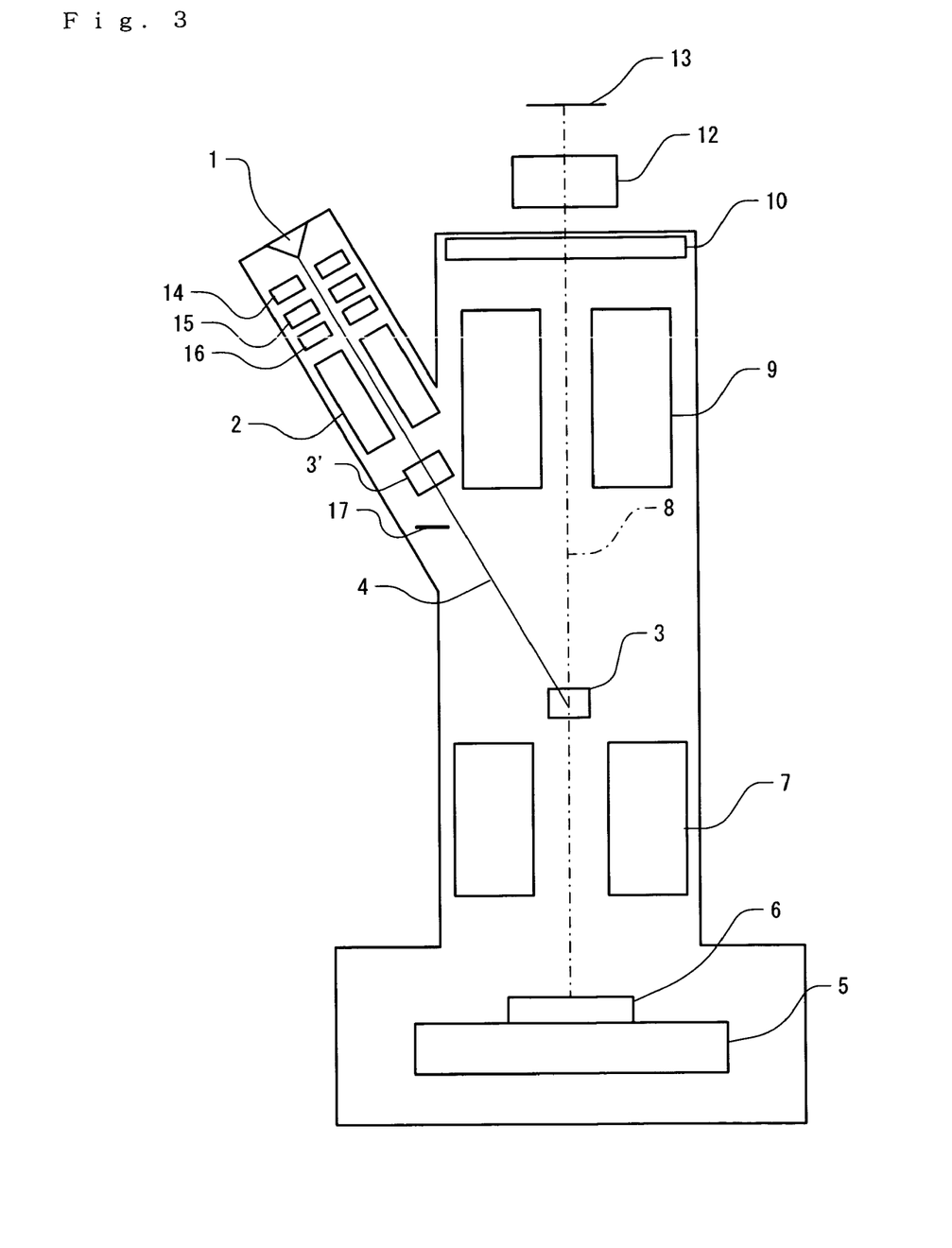
FIG. 3 is a diagram showing an outline of the optical system of a projection microscope constituting a third working configuration of the present invention.

FIG. 3 is a diagram showing an outline of the optical system of a projection microscope constituting a third working configuration of the present invention. This working configuration differs from the working configuration shown in FIG. 1 only in that a second deflector 3' is provided, and the electron absorbing plate 17 is installed after this second deflector. Accordingly, only the points of difference will be described.

This working configuration is used in cases where the absorption of the electrons by the electron absorbing plate 17 in the first working configuration shown in FIG. 1 is insufficient, so that reflected electrons and secondary electrons from the electron absorbing plate 17 enter the image focusing dedicated electron optical system 9, and cause noise.

In this working configuration, the deflector 3 and deflector 3' operate in synchronization, and the system is arranged so that when a voltage is applied to the deflector 3, no voltage is applied to the deflector 3', and so that when no voltage is applied to the deflector 3, a voltage is applied to the deflector 3'. Accordingly, in a case where a voltage is applied to the deflector 3, the illuminating beam 4 passes directly through the deflector 3', and is deflected by the deflector 3, after which the illuminating beam 4 reaches the surface of the sample 6. In a case where a voltage is applied to the deflector 3', the illuminating beam 4 is deflected by the deflector 3', and is absorbed by the electron absorbing plate 17.

In this case, since the electron absorbing plate 17 can be installed in a location that is separated from the image focusing dedicated electron optical system 9, even if secondary electrons or reflected electrons are generated in this location, there is little possibility that these electrons will cause noise in the image focusing dedicated electron optical system 9.

Figure 4:
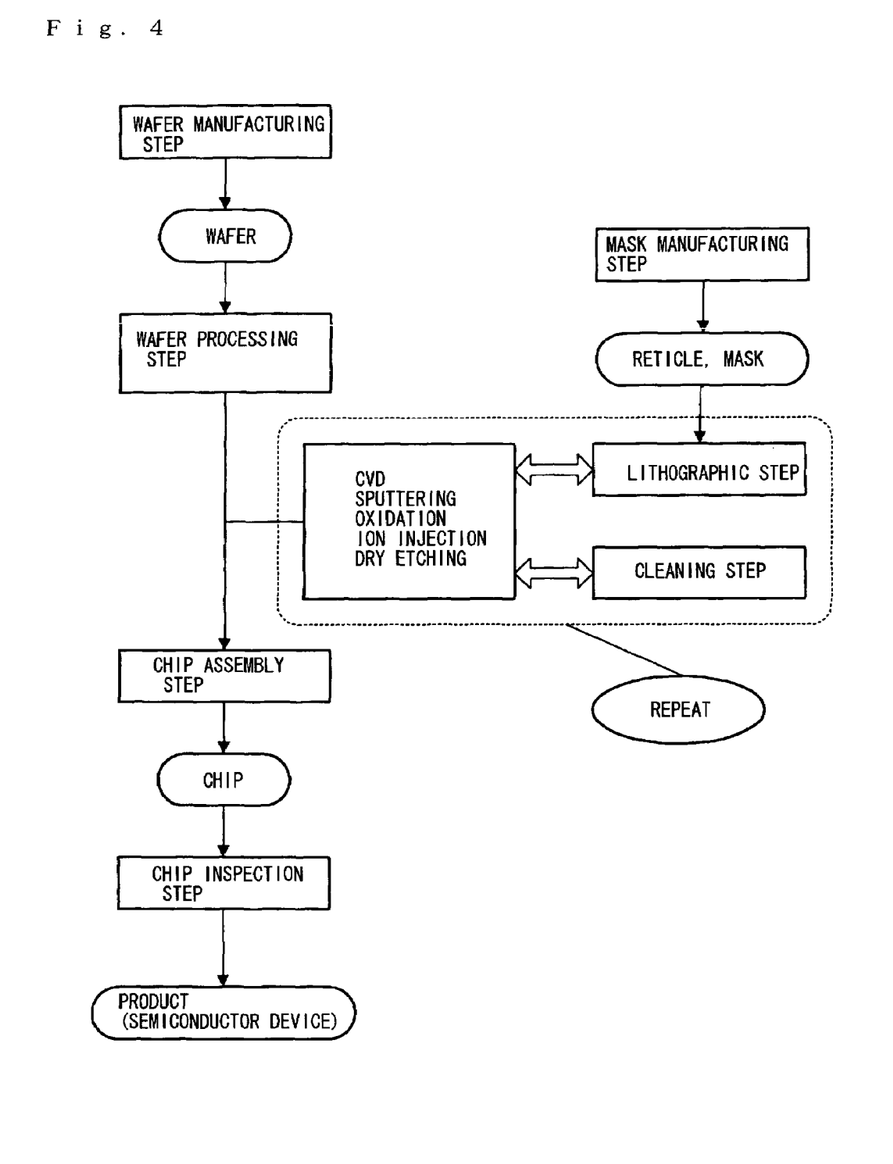
FIG. 4 is a flow chart showing one example of a semiconductor device manufacturing method constituting a working configuration of the present invention.

A working configuration of a semiconductor device manufacturing method constituting one working configuration of the present invention will be described below. FIG. 4 is a flow chart showing one example of this semiconductor manufacturing method constituting a working configuration of the present invention. The manufacturing process of this example includes the following main steps:

(1) Wafer manufacturing step in which a wafer is manufactured (or wafer preparation step in which a wafer is prepared);
(2) Mask manufacturing step in which a mask used for exposure is manufactured (or mask preparation step in which a mask is prepared);
(3) Wafer processing step in which necessary processing is performed on the wafer;
(4) Chip assembly step in which chips formed on the wafer are cut out one at a time, and made operable; and
(5) Chip inspection step in which the finished chips are inspected.

Furthermore, the respective steps further consist of several sub-steps.

Among these main steps, the main step that has a definitive effect on the performance of the semiconductor device is the wafer processing step. In this step, the designed circuit patterns are successively stacked on the wafer, and numerous chips that act as memories or MPU are formed. This wafer processing step includes the following respective steps:

(1) Thin film formation step in which a dielectric thin film that forms an insulating layer, a wiring part, a metal thin film that forms electrode parts, or the like is formed (using CVD, sputtering, or the like);
(2) Oxidation step in which this thin film layer or wafer substrate is oxidized;

(3) Lithographic step in which a resist pattern is formed using a mask (reticle) for the selective working of the thin film layer, wafer substrate, or the like;
(4) Etching step in which the thin film layer or substrate is worked in accordance with the resist pattern (for example, using a dry etching technique);
(5) Ion/impurity injection and diffusion step;
(6) Resist stripping step; and
(7) Inspection step in which the worked wafer is further inspected.

Furthermore, the wafer processing step is repeatedly performed for the necessary number of layers, so that a semiconductor device that operates as designed is manufactured.

In the present working configuration, an inspection is performed using the projection electron microscope of the present invention in the chip inspection step in which the finished chip is inspected, and in the inspection step in which the worked wafer is inspected.

The invention claimed is:

1. A projection electron microscope which causes an illuminating electron beam emitted from an electron source to be incident on a sample surface via an illumination electron optical system, and which causes electrons emitted from this sample surface to be focused as an observation electron beam on a detection means via an image focusing electron optical system wherein this projection electron microscope has an optical path switching means which switches the direction of the illuminating electron beam or observation electron beam, and the optical path switching means has the function of switching the direction of the respective electron beams so that the illuminating electron beam is incident on the sample surface at a specified timing, and so that the observation electron beam reaches the detection means at a different specified timing.

2. The projection electron microscope according to claim 1, wherein the observation electron beam consists of reflected electrons having an energy equal to that of the illuminating electron beam, the illumination electron optical system consists of an illumination dedicated electron optical system disposed between the electron source and the optical path switching means, and an electron optical system disposed between the optical path switching means and the sample surface, the image focusing electron optical system consists of an image focusing dedicated electron optical system disposed between the detection means and the optical path switching means, and the electron optical system mentioned above, and the electron optical system shares some of the functions of the illumination electron optical system and the image focusing electron optical system.

3. The projection electron microscope according to claim 2, wherein the observation electron beam consists of reflected electrons having an energy equal to that of the illuminating electron beam, and the illumination electron optical system and the image focusing electron optical system consist only of an electron optical system disposed between the optical path switching means and the sample surface.

4. The projection electron microscope according to claim 1, wherein the optical path switching means has the function of conducting the illuminating electron beam to the sample surface in a time that is equal to or less than the time required for the electrons in the illuminating electron beam to reach the sample surface from the optical path switching means.

5. The projection electron microscope according to claim 1, wherein the optical path switching means has the function of conducting the illuminating electron beam to the sample surface in a time that is equal to or less than the time required for the electrons in the illuminating electron beam to complete a round trip between the most constricted point of the electron beam in the electron optical system and the sample.

6. A projection electron microscope which causes an illuminating electron beam emitted from an electron source to be incident on a sample surface via an illumination electron optical system, and which causes electrons emitted from this sample surface to be focused as an observation electron beam on a detection means via an image focusing electron optical system, wherein the observation electron beam consists of reflected electrons having an energy equal to that of the illuminating electron beam, the illumination electron optical system consists of an illumination dedicated electron optical system disposed between the electron source and an optical path switching means which switches the direction of the illuminating electron beam or observation electron beam, and an electron optical system disposed between the optical path switching means and the sample surface, the image focusing electron optical system consists of an image focusing dedicated electron optical system disposed between the detection means and the optical path switching means, and the electron optical system described above, and this electron optical system shares some of the functions of the illumination electron optical system and the image focusing electron optical system.

7. A micro-device manufacturing method having a step in which the surface of a micro-device or intermediate product of the same is inspected using the projection electron microscope of any one of claims 1 through 6.

8. An electron microscope comprising an electron source which causes an illuminating electron beam to be incident on a sample surface, a detector which detects electrons emitted from the sample surface as an observation electron beam, and an optical path switching means which causes the illuminating electron beam to be incident on the sample surface at a specified timing, and which causes the observation electron beam to reach the detector at a different specified timing.

9. The electron microscope according to claim 8, wherein the optical path switching means has the function of switching between the specified timing described above and the other specified timing described above according to whether or not a voltage is applied to this optical path switching means.

10. A sample surface observation method for observing a sample surface, wherein an illuminating electron beam is emitted, this illuminating electron beam is caused to be incident on the sample surface at a specified timing, observation electrons emitted from the sample surface are caused to reach a detector at a timing that is different from the specified timing described above, and the observation electrons are detected by the detector, so that an image of the sample surface is acquired.

11. An electron microscope comprising:
an illumination electron optical system having an electron source for irradiating an electron beam onto a sample surface;
a detecting system having a detector for receiving reflected electrons which are generated from the sample surface;
a switching means for switching the direction of said electron beam and the reflected electrons, wherein said switching means has the function of switching the direction of the electron beam so that the electron beam is incident on the sample at a first timing, and so that the reflected electrons reach said detector at a second timing.

12. The electron microscope according to claim 11 wherein said illumination electron optical system and said electron detecting system have a common path.

13. The electron microscope according to claim 12 wherein said switching means is disposed on said common path.

14. The electron microscope according to claim 13 wherein said switching means conducts the electron beam to the sample surface in a time that is equal to or less than the time required for the electrons in the electron beam to reach the sample surface from said switching means.

15. An electron microscope comprising:
- an illumination electron optical system having an electron source for irradiating an electron beam onto a sample surface;
- a detecting system having a detector for receiving reflected electrons which are generated from the sample surface;
- a deflector for switching the direction of said electron beam and the reflected electrons, wherein a voltage is applied to said deflector at a first time so that the electron beam is incident on the sample surface and no voltage is applied to said deflector at a second time so that the reflected electrons reach said detector.

16. An electron microscope comprising:
- an illumination electron optical system having an electron source for irradiating an electron beam onto a sample surface;
- a detecting system having a detector for receiving secondary electrons which are generated from the sample surface;
- a deflector for switching the direction of said electron beam and the secondary electrons, wherein a voltage is applied to said deflector at a first time so that the electron beam is incident on the sample surface and no voltage is applied to said deflector at a second time so that the secondary electrons reach said detector.

17. The electron microscope according to claim 16 wherein said illumination electron optical system and said electron detecting system have a common path.

18. The electron microscope according to claim 17 wherein said deflector is disposed on said common path.

19. The electron microscope according to claim 18 wherein said first time is equal to or less than the time required for the electron beam to reach the sample surface from said deflector.

20. A projection electron microscope comprising:
- an illumination electron optical system having an electron source for irradiating an electron beam onto a sample surface;
- a detecting system having a detector for receiving secondary electrons which are generated from the sample surface;
- a deflector for switching the direction of said electron beam and the secondary electrons, wherein a voltage is applied to said deflector at a first time so that the electron beam is incident on the sample surface and no voltage is applied to said deflector at a second time so that the secondary electrons reach said detector.

21. The projection electron microscope according to claim 20 wherein said illumination electron optical system and said electron detecting system have a common path.

22. The projection electron microscope according to claim 21 wherein said deflector is disposed on said common path.

23. The projection electron microscope according to claim 22 wherein said first time is equal to or less than the time required for the electron beam to reach the sample surface from said deflector.

* * * * *